(12) United States Patent
Keser et al.

(10) Patent No.: US 10,403,580 B2
(45) Date of Patent: Sep. 3, 2019

(54) MOLDED SUBSTRATE PACKAGE IN FAN-OUT WAFER LEVEL PACKAGE

(71) Applicant: Intel IP Corporation, Santa Clara, CA (US)

(72) Inventors: Lizabeth Keser, Munich (DE); Thomas Ort, Veitsbronn (DE); Thomas Wagner, Regelsbach (DE); Bernd Waidhas, Pettendorf (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/858,103

(22) Filed: Dec. 29, 2017

(65) Prior Publication Data

US 2019/0206800 A1    Jul. 4, 2019

(51) Int. Cl.
*H01L 23/538* (2006.01)
*H01L 23/00* (2006.01)
(Continued)

(52) U.S. Cl.
CPC ........ *H01L 23/5389* (2013.01); *H01L 21/481* (2013.01); *H01L 21/4853* (2013.01); *H01L 21/4857* (2013.01); *H01L 21/565* (2013.01); *H01L 21/568* (2013.01); *H01L 23/3114* (2013.01); *H01L 23/3128* (2013.01); *H01L 23/3135* (2013.01); *H01L 23/49833* (2013.01); *H01L 23/5383* (2013.01); *H01L 23/5385* (2013.01); *H01L 23/5386* (2013.01); *H01L 24/19* (2013.01); *H01L 24/20* (2013.01); *H01L 2224/16227* (2013.01);
(Continued)

(58) Field of Classification Search
CPC combination set(s) only.
See application file for complete search history.

(56) References Cited

U.S. PATENT DOCUMENTS

2003/0036219 A1    2/2003  Masumoto et al.
2015/0255361 A1    9/2015  Lee et al.
(Continued)

FOREIGN PATENT DOCUMENTS

EP    0611129    8/1994

OTHER PUBLICATIONS

"European Application Serial No. 18209344.3, Extended European Search Report dated May 3, 2019", 8 pgs.

*Primary Examiner* — Mamadou L Diallo
(74) *Attorney, Agent, or Firm* — Schwegman Lundberg & Woessner, P.A.

(57) ABSTRACT

An electronic device may include a semiconductor die. The electronic device may include a first routing layer. The first routing layer may be coupled to the semiconductor die. A first plurality of routing traces may be in electrical communication with the semiconductor die. The first plurality of routing traces may be positioned within a first routing footprint. The first routing footprint may have a width greater than a width of the semiconductor die.

A second routing layer may be coupled to the first routing layer. A second plurality of routing traces may be in electrical communication with the first plurality of routing traces. The second plurality of routing traces may be positioned within a second routing footprint. The second routing footprint may have a width greater than the width of the first routing footprint.

20 Claims, 6 Drawing Sheets

(51) Int. Cl.
*H01L 21/48* (2006.01)
*H01L 23/31* (2006.01)
*H01L 23/498* (2006.01)
*H01L 21/56* (2006.01)

(52) U.S. Cl.
CPC .............. *H01L 2224/224* (2013.01); *H01L 2924/15172* (2013.01); *H01L 2924/15311* (2013.01); *H01L 2924/15313* (2013.01); *H01L 2924/18161* (2013.01)

(56) References Cited

U.S. PATENT DOCUMENTS

| | | | |
|---|---|---|---|
| 2015/0255426 A1 | 9/2015 | Son et al. | |
| 2017/0194300 A1* | 7/2017 | Lin | H01L 23/34 |
| 2018/0197818 A1* | 7/2018 | Lin | H01L 23/5389 |
| 2018/0204802 A1* | 7/2018 | Lin | H01L 23/36 |

* cited by examiner

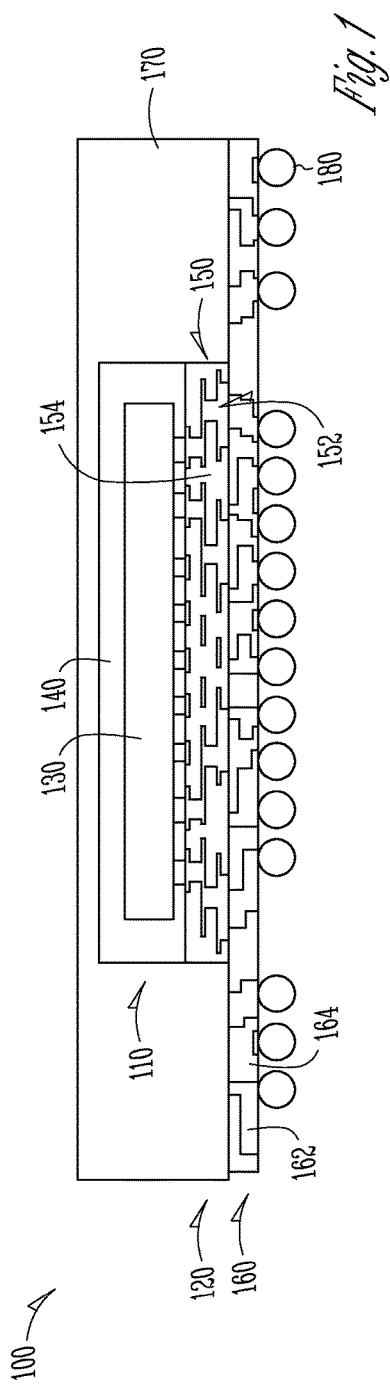
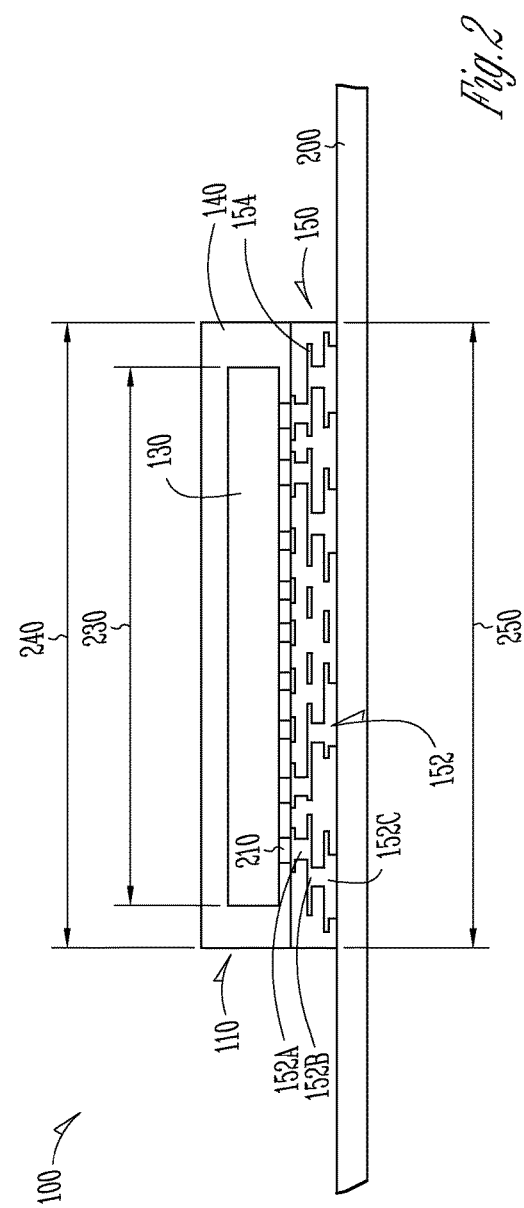

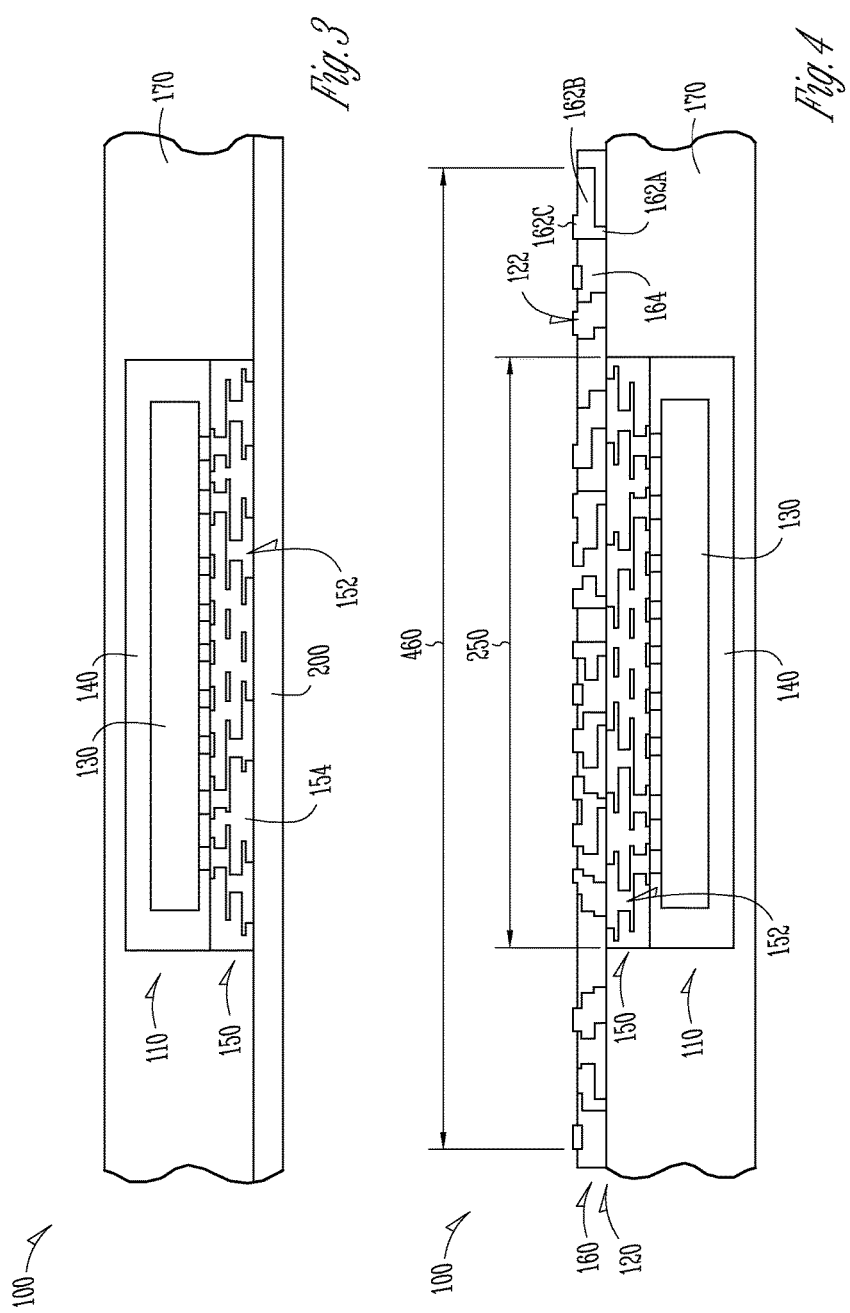

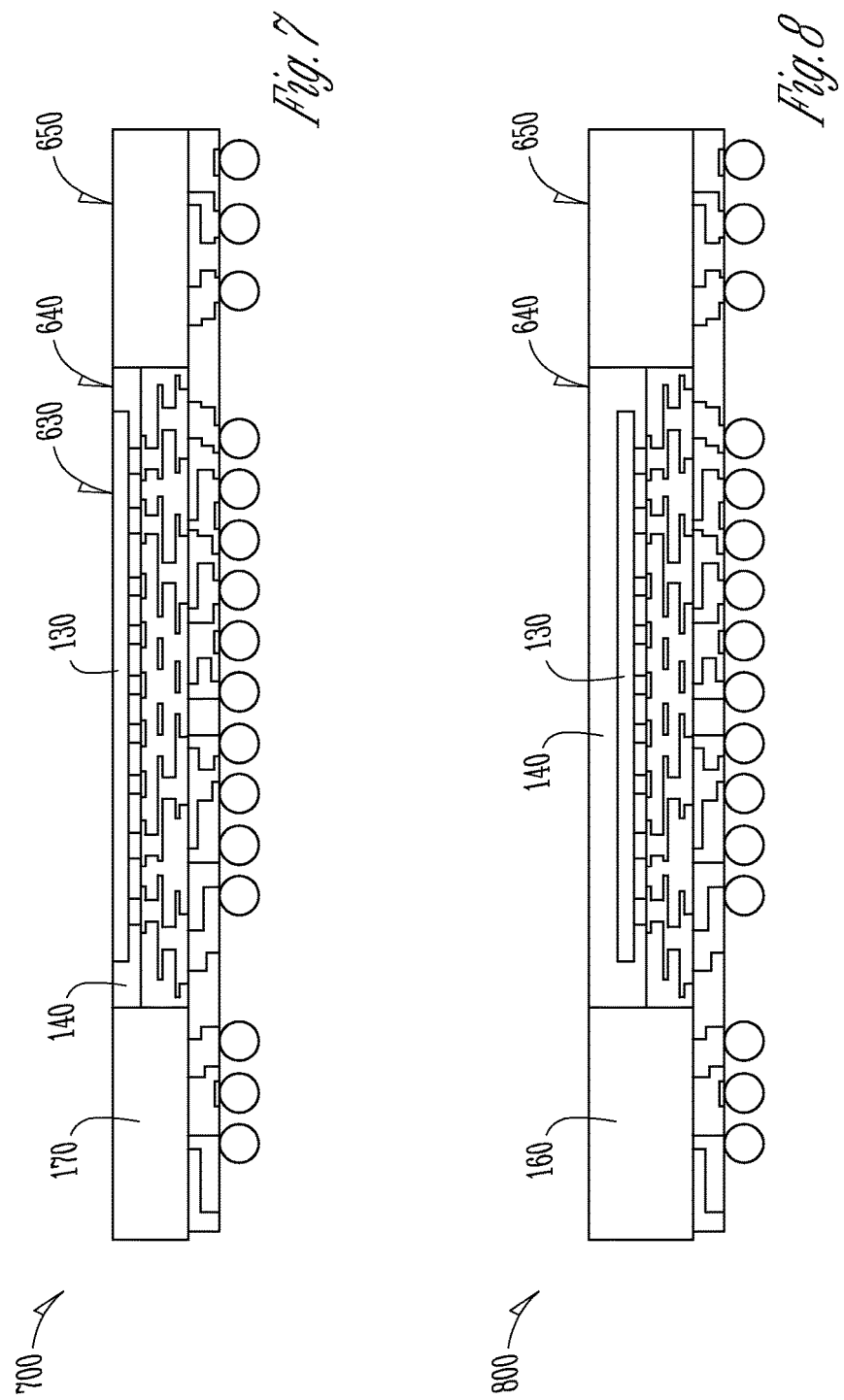

US 10,403,580 B2

MOLDED SUBSTRATE PACKAGE IN FAN-OUT WAFER LEVEL PACKAGE

BACKGROUND

Semiconductor die may be interconnected with additional structures to route signals to and from the semiconductor die.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 illustrates an example of a first electronic device.

FIG. 2 illustrates a manufacturing operation for the first electronic device of FIG. 1.

FIG. 3 illustrates an additional manufacturing operation for the first electronic device of FIG. 1.

FIG. 4 illustrates a further manufacturing operation for the first electronic device of FIG. 1.

FIG. 7 illustrates an example of a third electronic device.

FIG. 8 illustrates an example of a fourth electronic device.

DETAILED DESCRIPTION

Figure 5:
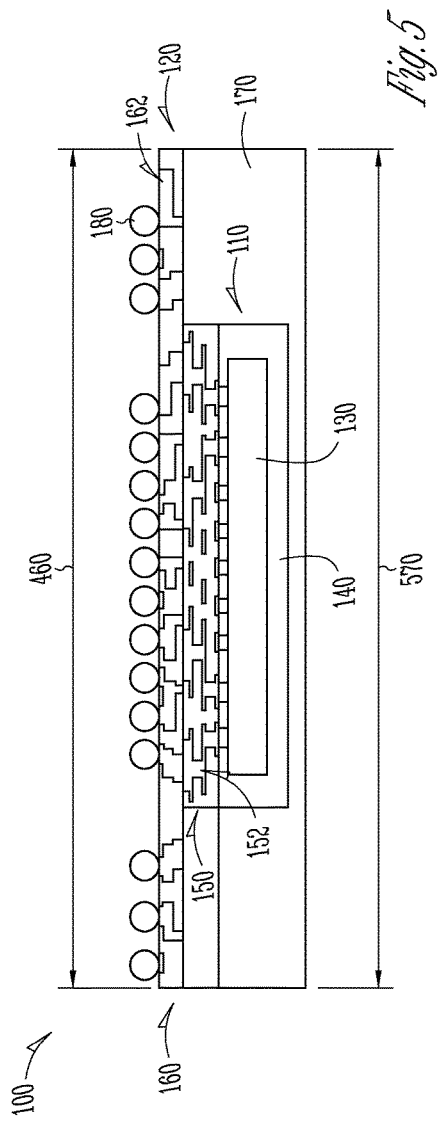
FIG. 5 illustrates yet another manufacturing operation for the first electronic device of FIG. 1.

The present inventors have recognized, among other things, that a problem to be solved may include improving the yield of packaging semiconductor die. The present inventors have recognized, among other things, that an additional problem to be solved may include decreasing the physical volume of semiconductor die packaging. The present inventors have recognized, among other things, that a further problem to be solved may include improving the performance of a semiconductor package.

The present subject matter may help provide a solution to these problems, such as by providing an electronic device. The electronic device may include a semiconductor die. The electronic device may include a first routing layer. The first routing layer may be coupled to the semiconductor die. The first routing layer may include a first substrate. The first substrate may be coupled to the semiconductor die. The first routing layer may include a first plurality of routing traces. The first plurality of routing traces may be in electrical communication with the semiconductor die. The first plurality of routing traces may be positioned within a first routing footprint. The first routing footprint may have a width greater than a width of the semiconductor die.

The electronic device may include a second routing layer. The second routing layer may be coupled to the first routing layer. The second routing layer may include a second substrate. The second routing layer may include a second plurality of routing traces. The second plurality of routing traces may be in electrical communication with the first plurality of routing traces. The second plurality of routing traces may be positioned within a second routing footprint. The second routing footprint may have a width greater than the width of the first routing footprint.

The electronic device may include a first molding compound. The first molding compound may form a direct interface with the first substrate. The first molding compound may enclose a portion of the semiconductor die. The electronic device may include a second molding compound. The second molding compound may form a direct interface with the first molding compound. The second molding compound may form a direct interface with the second substrate.

The present subject matter may help improve the yield of packaging semiconductor die, such as by coupling the semiconductor die to the first routing layer. The first routing layer may provide a suitable foundation for coupling to the semiconductor die. Coupling the semiconductor die to the first routing layer may improve the mechanical properties (e.g., resilience) of electrical connections to the semiconductor die. Coupling the semiconductor die to the first routing layer may allow for the semiconductor die to be tested before implementing the semiconductor die in additional manufacturing operations. Testing the semiconductor die before implementing the semiconductor die in additional manufacturing operations may improve the yield of the additional manufacturing operations, such as by preventing faulty components from being implemented into additional manufacturing operations.

Coupling the semiconductor die to the first routing layer may decrease the amount of electrical traces required in the second routing layer. Coupling the semiconductor die to the first routing layer may reduce the complexity of forming the second routing layer, such as by providing a suitable foundation to form the second routing layer. Reducing the complexity of forming the second routing layer may decrease the costs associated with manufacturing the electronic device.

The present subject matter may help decrease the physical volume of semiconductor die packaging. Coupling the semiconductor die to the first routing layer may allow for a greater number of semiconductor die to be simultaneously packaged during manufacturing, such as in a fan-out wafer level package. Coupling the first routing layer with the second routing layer may allow for a higher number of semiconductor die per unit area (e.g., density), as compared to coupling the semiconductor die to a printed circuit board. Increasing the density of semiconductor die may decrease the physical volume of semiconductor die packaging. The present subject matter may obviate the need to couple the semiconductor die to a printed circuit board, thereby decreasing the physical volume of the semiconductor die.

The present subject matter may help improve the performance of a semiconductor package, such as by reducing the length of interconnects between the semiconductor die and other elements. The present subject matter may help improve the performance of a semiconductor package, such as by eliminating the need to couple the semiconductor die to a printed circuit board. The present subject matter may help improve the performance of a semiconductor package, such as by preventing faulty semiconductor die, or faulty interconnections to the semiconductor die, from being implemented into additional manufacturing operations.

This overview is intended to provide an overview of subject matter of the present patent application. It is not intended to provide an exclusive or exhaustive explanation of the invention.

FIG. 1 illustrates an example of a first electronic device 100. The first electronic device 100 may include a first package component 110. The first electronic device 100 may include a second package component 120. The first package component 110 may include a semiconductor die 130. The first package component 110 may include a first molding material 140.

The first package component 110 may include a first routing layer 150. The first routing layer 150 may be manufactured as an individual component. Manufacturing the first routing layer 150 as an individual component may allow for a reduction of costs in manufacturing the first electronic device 100. Manufacturing the first routing layer 150 as an individual component may simplify the interconnection of the semiconductor die 130 with external structures. Manufacturing the first routing layer 150 as an individual component may allow for testing of the interconnections to the semiconductor die 130 before the semiconductor die 130 is included in additional manufacturing operations. Testing the interconnections to the semiconductor die 130 may prevent waste, such as by preventing a faulty first package component 110 from being implemented into additional manufacturing operations.

The first routing layer 150 may include a first plurality of routing traces 152. The first plurality of routing traces 152 may include conductors. The first routing layer 150 may include a first substrate 154. The first substrate 154 may include a dielectric. The first substrate 154 may be molded. The first substrate 154 may be molded, or pressed, over the first plurality of routing traces 152. The first substrate 154 may exhibit flow lines and final features that indicate the first substrate 154 was formed using a molding operation.

The second package component 120 may include a second molding material 170. The second molding material 170 may be referred to as an overmold material. The second package component 120 may include a second routing layer 160. The second package component 120 may include a second plurality of routing traces 162. The second plurality of routing traces 162 may include conductors. The first electronic device 100 may include one or more solder balls 180. The one or more solder balls 180 may be coupled to the second package component 120, such as the plurality of routing traces 162.

The second package component 120 may include a second substrate 164. The second substrate 164 may include a thin-film dielectric. The second substrate 164 may include a different material than the first substrate 154. The second plurality of routing traces 162 and the second substrate 164 may be included in the second routing layer 160.

FIG. 2 illustrates a manufacturing operation for the first electronic device 100 of FIG. 1. The first package component 110 may be mated with a carrier 200. A plurality of first package components 110 may be mated with the carrier 200. The carrier 200 may provide a suitable surface to perform manufacturing operations upon the first package component 110.

The semiconductor die 130 may be coupled to the first routing layer 150. The semiconductor die 130 may be coupled to the first substrate 154. Coupling the semiconductor die 130 to the first routing layer 150 may provide a suitable foundation to interconnect the semiconductor die 130 with additional elements. Coupling the semiconductor die 130 to the first routing layer 150 may allow for the semiconductor die to be tested before implementing the semiconductor die 130 in additional manufacturing operations.

As described herein, the first routing layer 150 may be manufactured as an individual component. The semiconductor die 130 may be coupled to the first routing layer 150. The semiconductor die 130 may include pins 210 coupled to the semiconductor die 130. The pins 210 may be coupled to the semiconductor die 130 by a process including electroplating, physical deposition (e.g., sputtering), chemical deposition (e.g., an electroless process), or the like. The pins 210 may be formed at a fine pitch to match with a scale of semiconductor devices formed on a surface, or within an active surface of the die 102.

The semiconductor die 130 may be in electrical communication with the first routing layer 150, such as through the coupling of the pins 210 with the first plurality of routing traces 152. The semiconductor die 130 may be coupled to the first plurality of routing traces 152 using solder. The pins 210 may facilitate the electrical communication between the first plurality of routing traces 150 and the semiconductor die 130. The coupling of the semiconductor die 130 to the first routing layer 150 may include establishing one or more electrical communication pathways between the first plurality of wiring traces 152 and the semiconductor die 130.

The first plurality of routing traces 152 may include a first conductive pillar 152A, a first lateral trace 152B, and a first pad 152C. The first conductive pillar 152A, the first lateral trace 152B, and the first pad 152C may be configured to route electrical signals to and from the semiconductor die 130. The first plurality of routing traces 150 may be configured to increase the pitch of electrical connections to the semiconductor die 130. In an example, the pins 210 of the semiconductor die 130 have a first pitch. The pads 152C of the first routing layer 150 may have a second pitch. The first pitch may be less than the second pitch. Utilization of the first conductive pillar 152A, the first lateral trace 152B, and/or the first pad 152C may allow for the arrangement of electrical connections to the semiconductor die 130 (e.g., the pins 210) to be changed.

In an example, utilization of the first conductive pillar 152A, the first lateral trace 152B, and/or the first pad 152C may allow for a change in pitch, such as by coupling the first conductive pillar 152A to the pins 210. The pins 210 may have a first pitch. The first plurality of wiring traces 152 may route the signals to the first pads 152C. The first pads 152C may have a second pitch.

The term "footprint" may be defined as the area covered by, or occupied by, an element. The semiconductor die 130 may have a semiconductor footprint 230. The first molding material 140 may have a first molding footprint 240. The first routing layer 150 may have a first routing layer footprint 250.

A width of the first routing layer footprint 250 may be greater than a width of the semiconductor footprint 230. The first molding footprint 240 may be greater than (e.g., have dimensions larger than) the semiconductor footprint 230. The first routing layer footprint 250 may be coextensive with the first molding footprint 240. The first routing layer footprint 250 may be substantially coextensive with the first molding footprint 240. The first routing layer footprint 250 may be greater than the first molding footprint 240.

The first plurality of routing traces 152 may be positioned within the first routing footprint 250. The first plurality of routing traces 152 may be substantially coextensive with the first molding footprint 240. In an example, the first plurality of routing traces 152 shown in FIG. 2 occupy substantially the same space as the first molding footprint 240. The first plurality of routing traces 152 may substantially span the first routing layer footprint 250. The first substrate 154 may occupy the portions of the first routing footprint 250 that the first plurality of routing traces 152 do not occupy. In an example, configuring the width of first routing layer footprint 250 to be greater than the width of the semiconductor footprint 240 may allow for a change in pitch of electrical connections to the semiconductor die 130.

The first molding material 140 may form a direct interface with the semiconductor die 130. The first molding material 140 may enclose a portion of the semiconductor die 130. The first molding material 140 may enclose a substantial portion of the semiconductor die 130. The first molding material 140 may form a direct interface with the first routing layer 150, such as with the first substrate 154.

FIG. 3 illustrates an additional manufacturing operation for the first electronic device 100 of FIGS. 1-2. The first electronic device 100 may include the second molding material 170. The second molding material 170 may be form a direct interface with the first package component 110. The second molding material 170 may form a direct interface with the carrier 200. The second molding material 170 may form a direct interface with the plurality of first package components 110. In an example, the plurality of first package components 110 may be mated with the carrier 100. The second molding material 170 may be coupled with (e.g., form an interface with) the plurality of first package components 110.

The second molding material 170 may form a direct interface with the first molding material 140. The second molding material 170 may form a direct interface with the first routing layer 150. The second molding material 170 may form a direct interface with the first substrate 154. A seam may exist at the interface between the second molding material 170 and the first package component 110. A seam may exist at the interface between the second molding material 170 and the first molding material 140. The seam may be observable through destructive evaluation (e.g., segmentation) or non-destructive evaluation (e.g., x-rays).

FIG. 4 illustrates a further manufacturing operation for the first electronic device 100 of FIGS. 1-3. The first electronic device 100 may be removed from the carrier 200 (shown in FIGS. 2-3). The first electronic device 100 may be repositioned, such as by being inverted with respect to the position shown in FIG. 2. The first electronic device 100 may be repositioned such that the first routing layer 150 is exposed (e.g., configured to have additional manufacturing operations performed upon the first routing layer 150). Repositioning the first electronic device 100 may expose the first routing layer 150.

The first electronic device 100 may include the second package component 120. The second package component 120 may be referred to as a fan-out wafer level package. The second package component 120 may be integrally formed onto the first package component, and the substrate 170 by using fan-out wafer level process techniques. One advantage of manufacturing using a fan-out wafer level process includes the ability to cheaply and easily form a number of small scale connections on a die (e.g., the semiconductor die 130), and to increase an amount of lateral area with which to form subsequent routing layers.

The second package component 120 may include the second routing layer 160. The second routing layer 160 may include the second substrate 164. The second molding material 170 may form a direct interface with the second substrate 164. The second routing layer 160 may be coupled to the first routing layer 150. Coupling the semiconductor die 130 to the first routing layer 150 may decrease the amount of routing traces required in the second routing layer 160. Coupling the semiconductor die 130 to the first routing layer 150 may reduce the complexity of forming the second routing layer 160, such as by providing a suitable foundation (in combination with the second molding material 170) to form the second routing layer 170.

The second routing layer 160 may include the second plurality of routing traces 162. The second plurality of routing traces 162 may be in electrical communication with the first plurality of routing traces 152. The second plurality of routing traces 162 may include a second conductive pillar 162A (e.g., a via), a second lateral trace 162B, and a second pad 162C. The second conductive pillar 162A, the second lateral trace 162B, and the second pad 162C may be configured to route electrical signals to and from the first routing layer 150. The second conductive pillar 162A, the second lateral trace 162B, and the second pad 162C may be in electrical communication with the first conductive pillar 152A, the first lateral trace 152B, and the first pad 152C (shown in FIG. 2). The second conductive pillar 162A, the second lateral trace 162B, and the second pad 162C may be configured to route electrical signals to and from the semiconductor die 130.

Utilization of the second conductive pillar 162A, the second lateral trace 162B, and/or the second pad 162C may allow for the arrangement (e.g., positions, spacing, quantity, or the like) of electrical connections to the first routing layer 150 (e.g., the first pads 152C) to be changed. In an example, utilization of the second conductive pillar 162A, the second lateral trace 162B, and/or the second pad 162C may allow for a change in pitch, such as by coupling to the first pads 152C having the second pitch and routing the signals to the second pads 162C having a third pitch. The third pitch may be greater than the second pitch. The second pitch may be greater than the first pitch. The third pitch may be greater than the first pitch.

The first routing layer 150 may have the first routing layer footprint 250. The second routing layer 160 may have a second routing layer footprint 460. The second plurality of routing traces 162 may be positioned with the second routing footprint 460. The second routing layer footprint 460 may be greater than (e.g., have larger dimensions than) the first routing layer footprint 250. The second routing layer footprint 460 may have a width greater than the width of the first routing layer footprint 250. Configuring the second routing layer footprint 460 to be greater than the first routing layer footprint 250 may allow for an increase in pitch from the first routing layer 150 to the second routing layer 160.

The first electronic device 100 may include a third routing layer. The third routing layer may be configured similarly to the second routing layer 160. The third routing layer may include a third substrate. The third substrate may include a thin-film dielectric. The third routing layer may include a third plurality of wiring traces. The third plurality of routing traces may be in electrical communication with either the first plurality of routing traces 152 or the second plurality of routing traces 162. The third plurality of routing traces may be positioned within a third routing layer footprint. The third routing layer footprint may be coextensive with the second routing layer footprint 460.

The second routing layer 160 may be positioned on a first side with respect to the semiconductor die 130. The third routing layer may be positioned on a second side with respect to the semiconductor die 130. The third routing layer may be coupled to a portion of first package component 110 and a portion of the second package component 120 in a package on package configuration.

One or more vias may be included in the first molding material 140. One or more vias may be included in the second molding material 140. The one or more vias may interconnect the semiconductor die 130, the first routing layer 150, the second routing layer 160, and/or the third routing layer.

FIG. 5 illustrates yet another manufacturing operation for the first electronic device 100 of FIGS. 1-4. In an example, the second molding material 170 may encompass the plurality of first package components 110. The second package component 120 may be coupled to each of the first package components 110. Each of the plurality of first package components 110 may be coupled to a corresponding second package component 110. The first electronic device 100 may be singulated. Singulation of the first electronic device 100 may include removing a portion of the second molding material 170. Singulation of the first electronic device 100 may include removing a portion of the second routing layer 160. The first electronic device 100 may be singulated from adjacent electronic devices such that the first electronic device 100 includes a single first package component 110 and a single second package component 120. The first electronic device 100 may include more than one first package component 110 coupled to a single second package component 120.

The first electronic device 100 may include a second molding material footprint 570. Singulation of the electronic device may establish the second molding material footprint 570. The second routing layer footprint 460 may be substantially coextensive with the second molding material footprint 570. The second plurality of routing traces 162 may be substantially coextensive with the second molding material footprint 570.

The second plurality of routing traces 162 may be integrally formed. Integral forming may include plating or otherwise forming the second plurality of routing traces 162 directly onto the first package component 110. Integral forming is described in contrast to subsequent connection of a separate circuit board, by a connecting structure such as a solder ball.

The second plurality of routing traces 162 may be substantially coextensive with the second molding footprint 570. In an example, the second plurality of routing traces 162 occupy substantially the same space as the second molding footprint 240 (shown in FIG. 2). The second plurality of routing traces 162 may substantially span the second routing layer footprint 460. The second substrate 164 may occupy the portions of the second routing footprint 460 that the second plurality of routing traces 162 do not occupy. In an example, configuring a width of second routing layer footprint 460 to be greater than the width of the first routing layer footprint 250 (shown in FIGS. 2 and 4) may allow for a change in pitch of electrical connections to the first routing layer 150.

The solder balls 180 may be coupled to the second routing layer 160. The solder balls 180 may be configured to establish electrical connections between the first electronic device 100 and additional electronics. The solder balls 180 may be in electrical communication with the semiconductor die 130.

Figure 6:
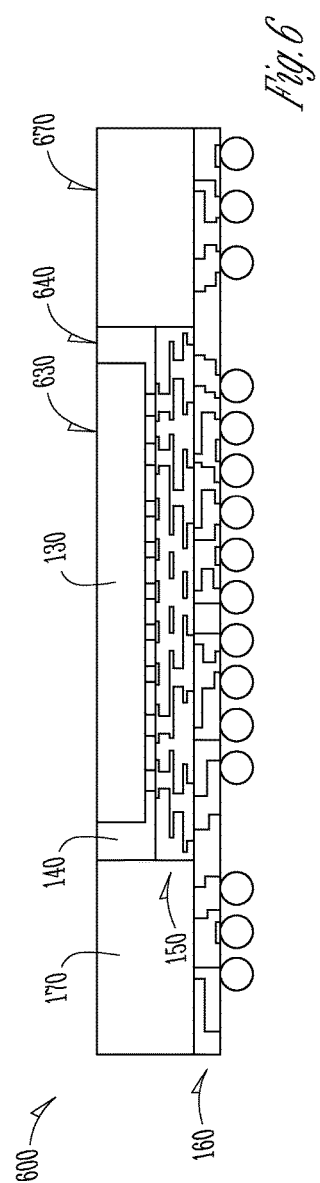
FIG. 6 illustrates an example of a second electronic device.

FIG. 6 illustrates an example of a second electronic device 600. In describing the second electronic device 600, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the second electronic device 600 include, but are not limited to, the corresponding numbered elements provided herein and other corresponding elements described herein (both numbered and unnumbered) as well as their equivalents.

The second electronic device 600 may include the first electronic device 100 (shown in FIGS. 1-5). The second electronic device 600 may be subject to additional manufacturing operations. The second electronic device 600 may be planarized. Planarizing the electronic device 600 may include making an exposed surface of the electronic device flat, or planar. Planarizing the second electronic device 600 may include removing a portion of the semiconductor die 130. Planarizing the second electronic device 600 may include removing a portion of the first molding material 140. Planarizing the second electronic device 600 may include removing a portion of the second molding material 170. Planarizing may include the simultaneous removal of portions of the semiconductor die 130, the first molding material 140, and/or the second molding material 170. Planarizing may be achieved by grinding the semiconductor die 130, the first molding material 140, and/or the second molding material 170. The simultaneous grinding of the semiconductor die 130, the first molding material 140, and/or the second molding material 170 may require specialized instrumentation configured to grind differing materials.

A first surface 630 of the semiconductor die 130 may be coplanar with a first surface 640 of the first molding material 140. The first surface 630 of the semiconductor die 130 may be coplanar with a first surface 670 of the second molding material 140. The first surface 640 of the first molding material 140 may be coplanar with the first surface 670 of the second molding material 170. The semiconductor die 130 may be exposed. Exposure of the semiconductor die 130 may improve the ability for the second electronic device 600 to dissipate heat generated by the semiconductor die 130, or by other elements. The semiconductor die 130 may be etched to remove imperfections from semiconductor die 130, such as the first surface 630 of the semiconductor die 130. Etching the semiconductor die may improve the mechanical strength of the semiconductor die 130.

FIG. 7 illustrates an example of a third electronic device 700. In describing the third electronic device 700, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the third electronic device 700 include, but are not limited to, the corresponding numbered elements provided herein and other corresponding elements described herein (both numbered and unnumbered) as well as their equivalents.

The semiconductor die 130 may have varying thicknesses depending upon design requirements for the third electronic device 700. In an example, the semiconductor die 130 shown in FIG. 7 has a height less than the semiconductor die 130 shown in FIGS. 1-6. The third electronic device 700 may enable the usage of thin semiconductor dies. The inclusion of the semiconductor die 130 in the first package component 110 may provide sufficient structural support to the semiconductor die 130. Improving the structural support for the semiconductor die 130 may allow for thinner semiconductor dies to be implemented into the third electronic device 700. Usage of thin semiconductor dies may allow for a decrease in the overall thickness of the third electronic device 700.

FIG. 8 illustrates an example of a fourth electronic device 800. In describing the fourth electronic device 800, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the fourth electronic device 800 include, but are not limited to, the corresponding numbered elements provided herein and other corresponding elements described herein (both numbered and unnumbered) as well as their equivalents.

The first molding material 140 may enclose the semiconductor die 130. The first molding material 140 may increase, or improve, the structural strength of the semiconductor die 130. Embedding the semiconductor die 130 in the first molding material 140 may obviate the need to dispose the second molding material 170 upon the first molding material 140 (e.g., at the first surface 640 of the first molding material 140). Embedding the semiconductor die 130 in the first molding material 140 may allow for a reduction in the overall height of the fourth electronic device 800. In an example, the first surface 640 of the first molding material 140 may be coplanar with the first surface 670 of the second molding material 170.

Figure 9:
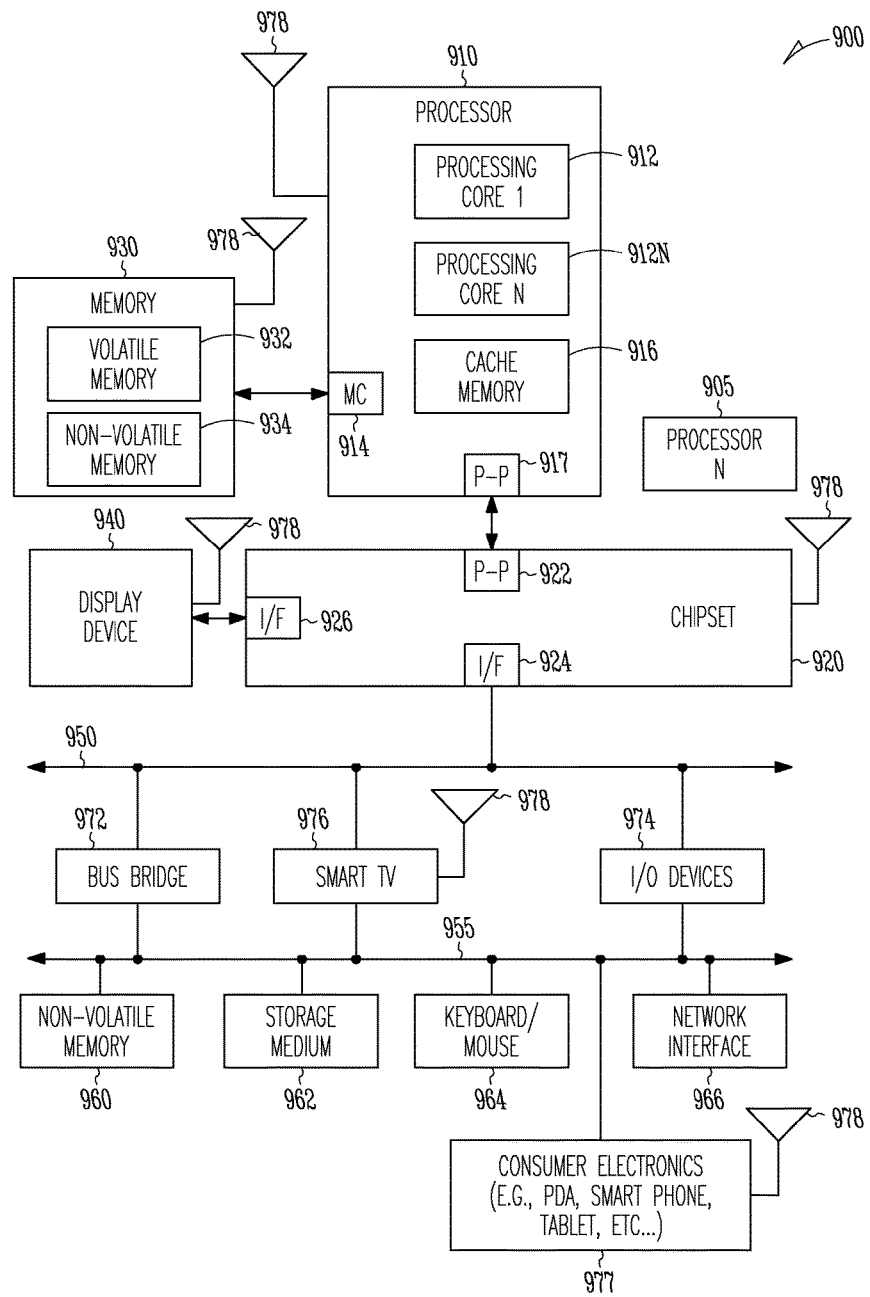
FIG. 9 illustrates a system level diagram, depicting an example of an electronic device (e.g., system) including the electronic device as described in the present disclosure.

FIG. 9 illustrates a system level diagram, depicting an example of an electronic device (e.g., system) including the first electronic device 100, the second electronic device 600, the third electronic device 700, and/or the fourth electronic device 800 as described in the present disclosure. FIG. 9 is included to show an example of a higher level device application for an electronic device, such as the first electronic device 100. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) may be incorporated into processor core 912.

Figure 10:
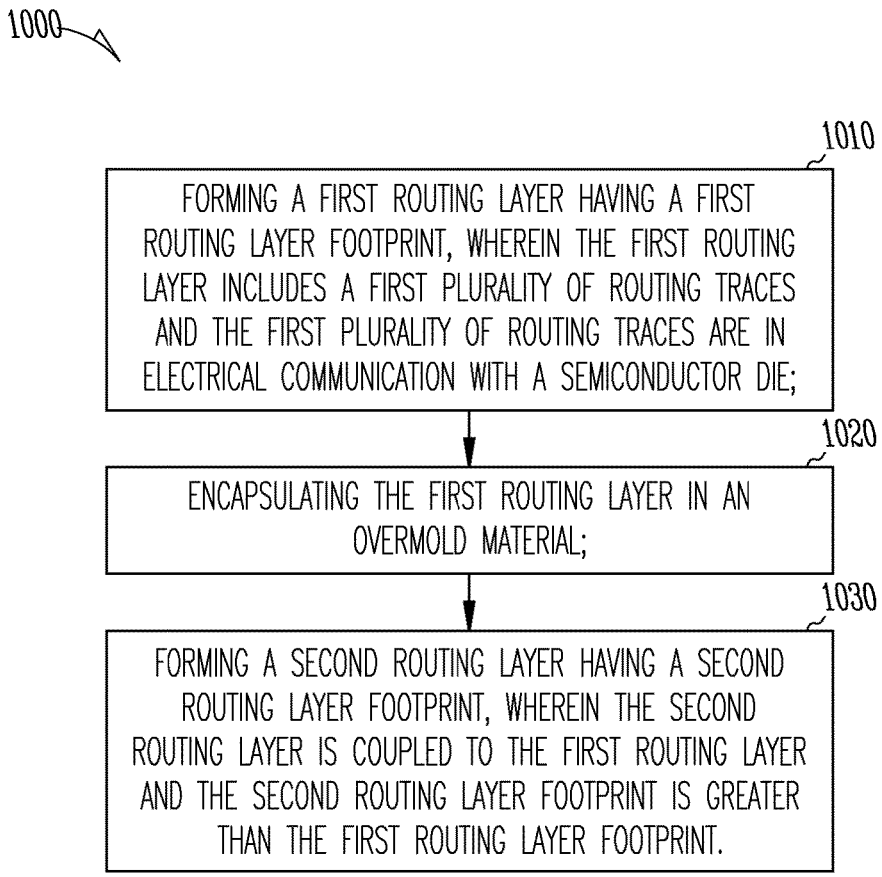
FIG. 10 illustrates a method for manufacturing the first electronic device.

FIG. 10 illustrates a method 1000 for manufacturing the first electronic device 100. The method 1000 may be used to manufacture other electronic devices, such as the second electronic device 600, the third electronic device 700, and/or the fourth electronic device 800. The method 1000 may include at operation 1010 forming a first routing layer (e.g., the first routing layer 150 of FIGS. 1-5). The first routing layer may have a first routing layer footprint (e.g., the first routing layer footprint 250 of FIGS. 2 and 4). The first routing layer may include a first plurality of routing traces (e.g., the first plurality of routing traces 152 of FIGS. 1-5). The first plurality of routing traces may be in electrical communication with a semiconductor die (e.g., the semiconductor die 130 of FIGS. 1-8).

The method 1000 may include at operation 1020 encapsulating the first routing layer in an overmold material (e.g., the second molding material 170 of FIGS. 1 and 3-8). The method 1000 may include at operation 1030 forming a second routing layer (e.g., the second routing layer 160 of FIGS. 1 and 4-5). The second routing layer may have a second routing layer footprint (e.g., the second routing layer footprint 460 of FIGS. 4 and 5). The second routing layer may be coupled to the first routing layer. The second routing layer footprint may be greater than the first routing layer footprint.

The method 1000 may include forming a molding material (e.g., the first molding material 140 of FIGS. 1-8). The molding material may enclose a first portion of the semiconductor die. The method 1000 may include encapsulating a portion of the molding material with the overmold material. The method 1000 may include forming the molding material such that the molding material forms a direct interface with a portion of the first routing layer. The method 1000 may include removing a second portion of the semiconductor die. The method 1000 may include removing a portion of the molding material such that a surface of the semiconductor die is exposed. The method 1000 may include simultaneously removing the second portion of the semiconductor die and the portion of the molding material.

The method 1000 may include removing a portion the semiconductor die and the overmold material such that a surface (e.g., the first surface 630 of FIGS. 6-7) of the semiconductor die is exposed. The method 1000 may include simultaneously removing the second portion of the semiconductor die and a portion of the overmold material. The method 1000 may include coupling a solder ball to the second routing layer. The method 1000 may include singulating the electronic device.

Various Notes and Examples

Aspect 1 may include or use subject matter (such as an apparatus, a system, a device, a method, a means for performing acts, or a device readable medium including instructions that, when performed by the device, may cause the device to perform acts), such as may include or use an electronic device. The electronic device may include a semiconductor die.

The electronic device may include a first routing layer. The first routing layer may be coupled to the semiconductor die. The first routing layer may include a first substrate. The first routing layer may include a first plurality of routing traces. The first plurality of routing traces may be in electrical communication with the semiconductor die. The first plurality of routing traces may be positioned within a first routing footprint. The first routing footprint may have a width greater than a width of the semiconductor die.

The electronic device may include a second routing layer. The second routing layer may be coupled to the first routing layer. The second routing layer may include a second substrate. The second routing layer may include a second plurality of routing traces. The second plurality of routing traces may be in electrical communication with the first plurality of routing traces. The second plurality of routing traces may be positioned within a second routing footprint. The second routing footprint may have a width greater than the width of the first routing footprint.

The electronic device may include a first molding material. The first molding material may form a direct interface with the first substrate. The first molding material may enclose a portion of the semiconductor die. The electronic device may include a second molding material. The second molding material may form a direct interface with the first molding material. The second molding material may form a direct interface with the second substrate.

Aspect 2 may include or use, or may optionally be combined with the subject matter of Aspect 1, to optionally include or use a third routing layer. The third routing layer may include a third substrate. The third routing layer may include a third plurality of wiring traces. The third plurality of routing traces may be in electrical communication with the first plurality of routing traces. The third plurality of routing traces may be in electrical communication with the second plurality of routing traces.

Aspect 3 may include or use, or may optionally be combined with the subject matter of one or any combination of Aspects 1 or 2 to optionally include or use that the first substrate is molded over the first plurality of routing traces.

Aspect 4 may include or use, or may optionally be combined with the subject matter of one or any combination of Aspects 1 through 3 to optionally include or use that the second routing layer may be a fan out wafer level package.

Aspect 5 may include or use, or may optionally be combined with the subject matter of one or any combination of Aspects 1 through 4 to optionally include or use that a first surface of the semiconductor die may be exposed.

Aspect 6 may include or use, or may optionally be combined with the subject matter Aspect 5 to optionally include or use that the first surface of the semiconductor die may be coplanar with the first molding material and the second molding material.

Aspect 7 may include or use, or may optionally be combined with the subject matter of one or any combination of Aspects 1 through 6 to optionally include or use one or more solder balls. The one or more solder balls may be coupled to the second routing layer.

Aspect 8 may include or use, or may optionally be combined with the subject matter of one or any combination of Aspects 1 through 7 to optionally include or use a plurality of pins. The plurality of pins may be coupled to the semiconductor die. The plurality of pins may facilitate the electrical communication between the first plurality of routing traces and the semiconductor die.

Aspect 9 may include or use subject matter (such as an apparatus, a system, a device, a method, a means for performing acts, or a device readable medium including instructions that, when performed by the device, may cause the device to perform acts), such as may include or use a method for manufacturing an electronic device.

The method may include forming a first routing layer. The first layer may have a first routing layer footprint. The first routing layer may include a first plurality of routing traces. The first plurality of routing traces may be in electrical communication with a semiconductor die. The method may include encapsulating the first routing layer in a first molding material. The method may include forming a second routing layer. The second routing may have a second routing layer footprint. The second routing layer may be coupled to the first routing layer. The second routing layer footprint may be greater than the first routing layer footprint.

Aspect 10 may include or use, or may optionally be combined with the subject matter of Aspect 9, to optionally include or use that the method may include forming a second molding material. The second molding material may enclose a first portion of the semiconductor die.

Aspect 11 may include or use, or may optionally be combined with the subject matter of Aspect 10 to optionally include or use that the method may include encapsulating a portion of the second molding material with the first molding material.

Aspect 12 may include or use, or may optionally be combined with the subject matter of one or any combination of Aspects 10 or 11 to optionally include or use that the method may include forming the second molding material. The second molding material may form a direct interface with a portion of the first routing layer.

Aspect 13 may include or use, or may optionally be combined with the subject matter of one or any combination of Aspects 10 through 12 to optionally include or use that the method may include removing a second portion of the semiconductor die and a portion of the second molding material such that a surface of the semiconductor die is exposed.

Aspect 14 may include or use, or may optionally be combined with the subject matter of one Aspect 13 to optionally include or use that the second portion of the semiconductor die may be removed simultaneously with the second molding material.

Aspect 15 may include or use, or may optionally be combined with the subject matter of one or any combination of Aspects 10 through 14 to optionally include or use that the first plurality of routing traces may be substantially coextensive with the second molding material.

Aspect 16 may include or use, or may optionally be combined with the subject matter of one or any combination of Aspects 9 through 15 to optionally include or use that the second plurality of routing traces may be substantially coextensive with the first molding material.

Aspect 17 may include or use, or may optionally be combined with the subject matter of one or any combination of Aspects 9 through 16 to optionally include or use that the method may include removing a second portion the semiconductor die and the first molding material such that a surface of the semiconductor die is exposed.

Aspect 18 may include or use, or may optionally be combined with the subject matter of Aspect 17 to optionally include or use that the second portion of the semiconductor die may be removed simultaneously with the first molding material.

Aspect 19 may include or use, or may optionally be combined with the subject matter of one or any combination of Aspects 9 through 18 to optionally include or use that the method may include coupling a solder ball to the second routing layer.

Aspect 20 may include or use, or may optionally be combined with the subject matter of one or any combination of Aspects 9 through 19 to optionally include or use that the method may include singulating the electronic device.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device, comprising:
   a semiconductor die having a first surface and a second surface, wherein the second surface includes die interconnects;
   a first routing layer coupled to the die interconnects of the semiconductor die, the first routing layer including:
   a first substrate,
   a first plurality of routing traces in electrical communication with the semiconductor die, wherein the first plurality of routing traces are positioned within a first routing footprint and the first routing footprint has a width greater than a width of the semiconductor die;
   a second routing layer coupled to the first routing layer, the second routing layer including:
   a second substrate,
   a second plurality of routing traces in electrical communication with the first plurality of routing traces, wherein the second plurality of routing traces are positioned within a second routing footprint, and
   wherein the second routing footprint has a width greater than the width of the first routing footprint;
   a first molding material forming a direct interface with the first substrate and enclosing a portion of the semiconductor die; and
   a second molding material forming a direct interface with the first molding material and the second substrate, wherein the first surface of the semiconductor die, the first molding material, and the second molding material are coplanar.

2. The electronic device of claim 1, further comprising a third routing layer, including:
   a third substrate, and
   a third plurality of wiring traces in electrical communication with either the first plurality of routing traces or the second plurality of routing traces.

3. The electronic device of claim 1, wherein the first substrate is molded over the first plurality of routing traces.

4. The electronic device of claim 1, wherein the second routing layer is a fan out wafer level package.

5. The electronic device of claim 1, wherein the first surface of the semiconductor die is exposed.

6. The electronic device of claim 1, further comprising one or more solder balls coupled to the second routing layer.

7. The electronic device of claim 1, wherein the die interconnects include a plurality of pins coupled to the semiconductor die, wherein the plurality of pins facilitate the electrical communication between the first plurality of routing traces and the semiconductor die.

8. A method for manufacturing an electronic device, comprising:
   fully enclosing a semiconductor die in a first molding material;
   forming a first routing layer having a first routing layer footprint, wherein the first routing layer includes a first plurality of routing traces and the first plurality of routing traces are in electrical communication with die interconnects of the semiconductor die;
   encapsulating the first routing layer and the first molding material in a second molding material;
   forming a second routing layer having a second routing layer footprint, wherein the second routing layer is coupled to the first routing layer and the second routing layer footprint is greater than the first routing layer footprint.

9. The method of claim 8, further comprising forming a second molding material such that the second molding material encloses a first portion of the semiconductor die.

10. The method of claim 9, further comprising encapsulating a portion of the second molding material with the first molding material.

11. The method of claim 9, further comprising forming the second molding material such that the second molding material forms a direct interface with a portion of the first routing layer.

12. The method of claim 9, further comprising removing a second portion of the semiconductor die and a portion of the second molding material such that a surface of the semiconductor die is exposed.

13. The method of claim 12, wherein the second portion of the semiconductor die is removed simultaneously with the second molding material.

14. The method of claim 9, wherein the first plurality of routing traces are substantially coextensive with the second molding material.

15. The method of claim 8, wherein the second plurality of routing traces are substantially coextensive with the first molding material.

16. The method of claim 8, further comprising removing a second portion the semiconductor die and the first molding material such that a surface of the semiconductor die is exposed.

17. The method of claim 16, wherein the second portion of the semiconductor die is removed simultaneously with the first molding material.

18. An electronic device, comprising:
   a semiconductor die having a first surface and a second surface, wherein the second surface includes die interconnects;
   a first routing layer coupled to the die interconnects of the semiconductor die, the first routing layer including:
   a first substrate,
   a first plurality of routing traces in electrical communication with the semiconductor die, wherein the first plurality of routing traces are positioned within a first routing footprint and the first routing footprint has a width greater than a width of the semiconductor die;
   a second routing layer coupled to the first routing layer, the second routing layer including:

a second substrate, a second plurality of routing traces in electrical communication with the first plurality of routing traces, wherein the second plurality of routing traces are positioned within a second routing footprint, and wherein the second routing footprint has a width greater than the width of the first routing footprint;

a first molding material forming a direct interface with the first substrate and fully enclosing the semiconductor die; and a second molding material forming a direct interface with the first molding material and the second substrate.

19. The electronic device of claim 18, wherein the first substrate is molded over the first plurality of routing traces.

20. The electronic device of claim 18, further comprising a third routing layer, including:

a third substrate, and a third plurality of wiring traces in electrical communication with either the first plurality of routing traces or the second plurality of routing traces.

\* \* \* \* \*